United States Patent [19]

Yerman

[11] Patent Number: 4,500,029

[45] Date of Patent: Feb. 19, 1985

[54] ELECTRICAL ASSEMBLY INCLUDING A CONDUCTOR PATTERN BONDED TO A NON-METALLIC SUBSTRATE AND METHOD OF FABRICATING SUCH ASSEMBLY

[75] Inventor: Alexander J. Yerman, Scotia, N.Y.

[73] Assignee: General Electric Company, Schenectady, N.Y.

[21] Appl. No.: 387,717

[22] Filed: Jun. 11, 1982

[51] Int. Cl.³ .............................................. H05K 3/06
[52] U.S. Cl. ................................. 228/123; 228/159; 228/198; 29/847
[58] Field of Search ................... 228/198, 159, 123; 29/847

[56] References Cited

U.S. PATENT DOCUMENTS

| | | | |
|---|---|---|---|
| 2,857,663 | 10/1958 | Beggs | 29/473.1 |
| 3,766,634 | 10/1973 | Babcock et al. | 29/441.9 |
| 3,994,430 | 11/1976 | Cusano et al. | 228/122 |
| 4,413,766 | 11/1983 | Webster | 228/198 |

Primary Examiner—Kenneth J. Ramsey
Attorney, Agent, or Firm—Charles E. Bruzga; James C. Davis, Jr.; Marvin Snyder

[57] ABSTRACT

An electrical assembly includes a conductor pattern, a non-metallic substrate, and a eutectic alloy situated between and bonding together the conductor pattern and the substrate. The conductor pattern includes an area with a surface facing the non-metallic substrate but spaced from the substrate. A method of fabricating such assembly includes, prior to bonding, the step of partially penetrating through the side of the metallic sheet to be bonded to the substrate in selected areas of the sheet. The remaining metal of the sheet in each selected area does not bond to the substrate during a eutectic bonding procedure. The non-bonded areas can implement a variety of structural features, including: (1) an electrical interconnect member which can operate at higher voltages due to a lengthened electrical creepage path on the surface of the non-metallic substrate: (2) a mechanical interconnect member for holding separate portions of a metallic sheet in alignment with each other prior to bonding to a substrate; and (3) a "via" or bridge-like member of one conductor pattern which crosses over another conductor pattern, both of which patterns are bonded to a non-metallic substrate.

10 Claims, 7 Drawing Figures

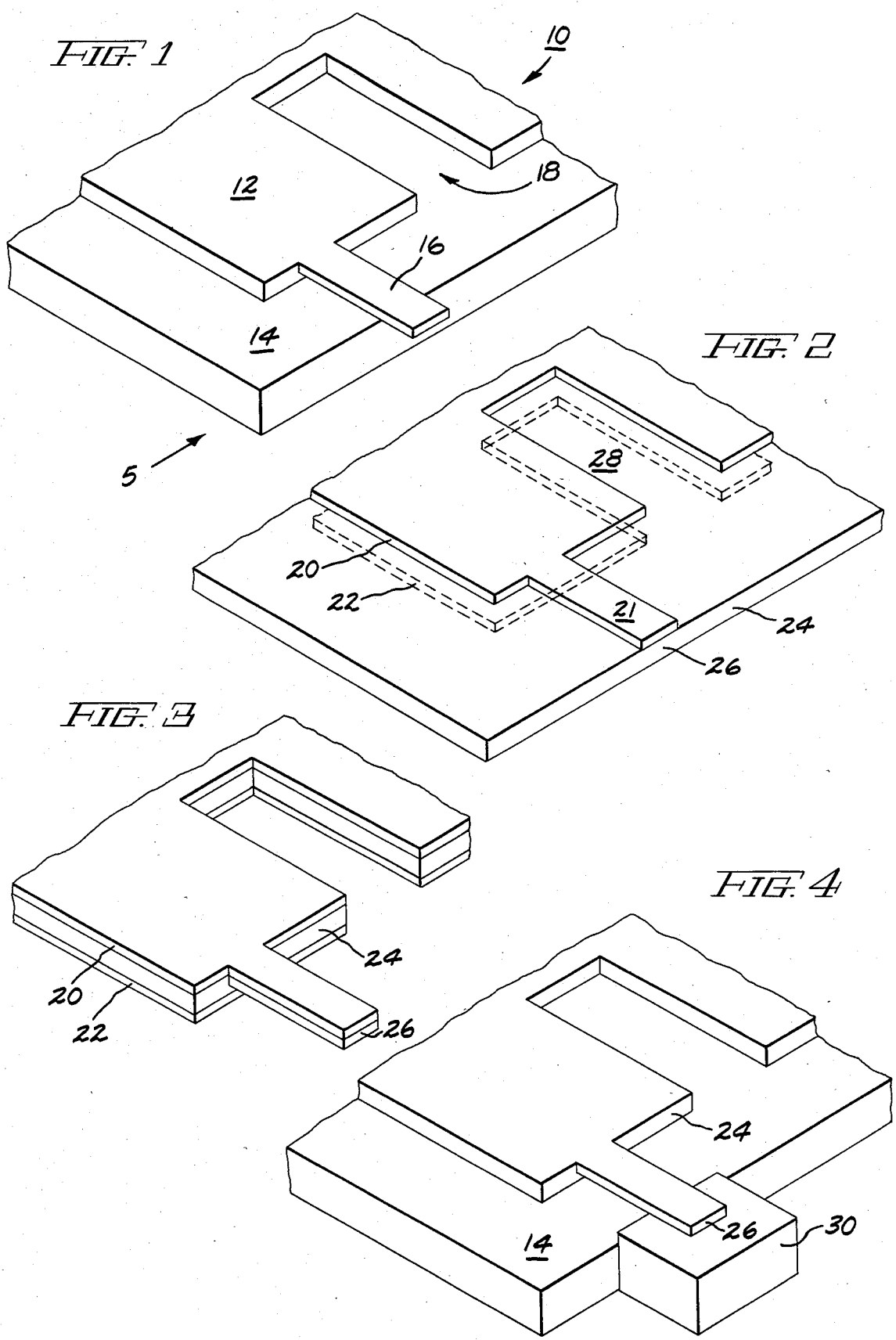

ELECTRICAL ASSEMBLY INCLUDING A CONDUCTOR PATTERN BONDED TO A NON-METALLIC SUBSTRATE AND METHOD OF FABRICATING SUCH ASSEMBLY

BACKGROUND OF THE INVENTION

My invention relates to an electrical assembly including a conductor pattern bonded to a non-metallic substrate in some areas but not bonded to the non-metallic substrate in other areas, and to a method of fabricating such assembly, and, more particularly, to such assembly and method wherein a conductor pattern is formed from a metallic sheet which is bonded to a non-metallic substrate by means of a eutectic bonding technique.

Various eutectic bonding techniques exist for bonding a metallic sheet to a non-metallic substrate. These techniques all share in common the formation of a molten eutectic alloy, typically derived in part from the metallic sheet, between the sheet and the substrate at an elevated temperature. Such elevated temperature is near, but somewhat below, the melting point of the metallic sheet. The molten eutectic alloy wets the non-metallic substrate and thus assures a strong bond between sheet and substrate.

It is known that a metallic sheet, when heated to an elevated temperature as it is being bonded to a substrate with a eutectic bonding technique, is likely to plastically conform to the shape of the substrate. This is desirable to attain a uniform bond between the metallic sheet and the substrate. However, there are instances in which it would be advantageous to ensure that selected areas of a metallic sheet did not plastically conform to the shape of the substrate and consequently become bonded to the sheet. For example, where the metallic sheet is patterned to implement a conductor pattern upon which heat-producing electrical devices, such as power transistors, are usually mounted and which includes an electrical interconnect member, it would be desirable to have the interconnect member bridge over part of the upper surface of the non-metallic substrate. This would enable the conductor pattern to withstand higher voltage, due to an increased distance of separation along the surface of the substrate between the interconnect member and a metallic heat sink at electrical ground, on which the substrate is typically disposed.

SUMMARY OF THE INVENTION

Accordingly, it is an object of my invention to provide an electrical assembly including a conductor pattern bonded to a non-metallic substrate by means of a eutectic bonding technique, wherein the conductor pattern includes non-bonded members facing the substrate but separated therefrom.

It is a further object of my invention to provide a method of fabricating an electrical assembly including a conductor pattern bonded to a non-metallic substrate by means of a eutectic bonding technique, with the conductor pattern including members which face the substrate but are not bonded thereto.

It is a still further object of my invention to provide a method of fabricating an electrical assembly including a conductor pattern bonded to a non-metallic substrate by means of a eutectic bonding technique and which includes non-bonded members facing the substrate but separated therefrom, the method not requiring additional process steps to implement the non-bonded members.

Briefly stated, in carrying out a particular form of my invention, I expose selected areas of one side of a metallic sheet to a wet chemical etchant to partially etch through the sheet. Thereafter, I bond the metallic sheet to a non-metallic substrate by forming at an elevated temperature a molten eutectic alloy between the sheet and the substrate, which wets the substrate and provides a strong, stable bond upon cooling. At least in a useful range of cases, as discussed below, I have found that the unetched metal of the metallic sheet in each selected area does not plastically conform and bond to the substrate, even though the remaining area of the metallic sheet does bond to the substrate.

BRIEF DESCRIPTION OF THE DRAWINGS

While the specification concludes with claims particularly pointing out and distinctly claiming the subject matter which I regard as my invention, it is believed that the invention will be better understood with reference to the following description, taken in conjunction with the drawings, in which:

FIG. 1 is a view in perspective of a fragmentary portion of an electrical assembly including a conductor pattern bonded to a substrate in accordance with my invention;

FIGS. 2-4 are views similar to FIG. 1 illustrating various steps in fabricating the electrical assembly of FIG. 1;

DETAILED DESCRIPTION OF A PREFERRED EMBODIMENT OF THE INVENTION

Figure 5:
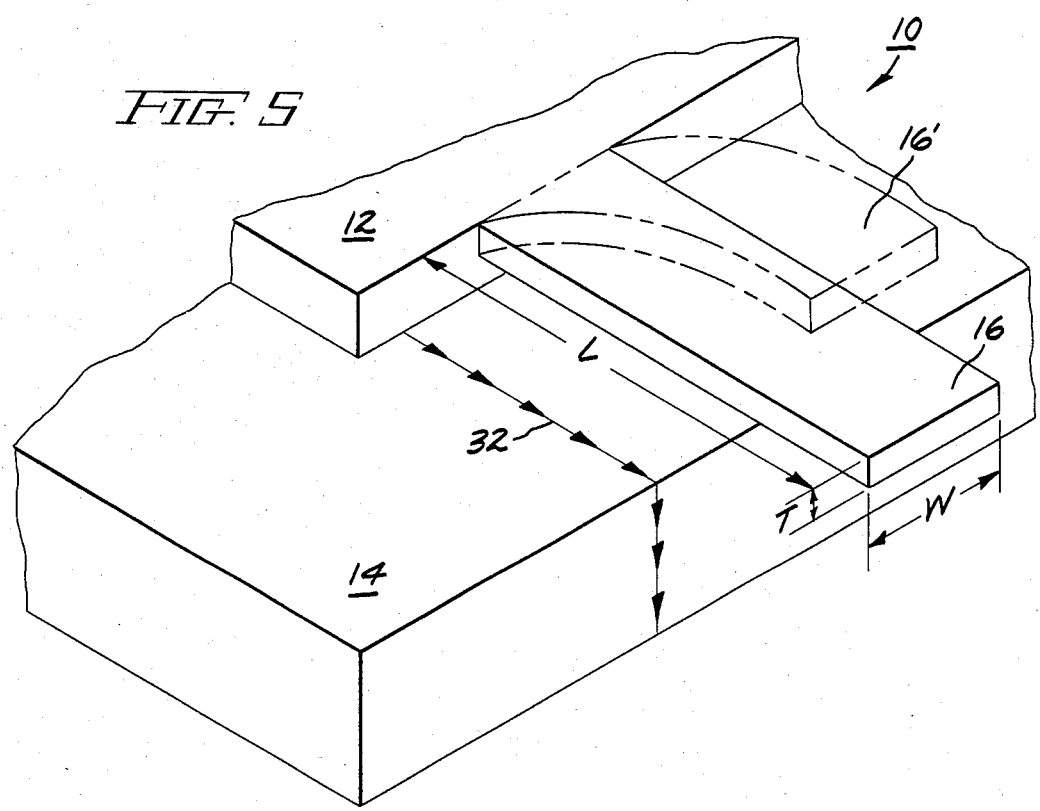
FIG. 5 is an enlarged detail view taken at arrow 5 in FIG. 1.

Turning to FIG. 1, there is shown a portion of an electrical assembly 10 fabricated from a preferred method in accordance with my invention. Assembly 10 includes a conductor pattern 12, fashioned from a metallic sheet such as copper, and a non-metallic substrate 14, such as a ceramic (e.g., alumina or beryllia). Conductor pattern 12 has been bonded to substrate 14 by a eutectic bonding technique.

Conductor pattern 12 includes an electrical interconnect member 16, which is not bonded to substrate 14. Additionally, conductor pattern 12 further includes a feature 18 such as is typically included in a completed conductor pattern 12.

A preferred method of fabricating assembly 10 is now described with reference to FIGS. 2-4.

As shown in FIG. 2, I form photoresist patterns 20 and 22 on the upper and lower surfaces, respectively, of a metallic sheet 24, using known photolithographic techniques. The photoresist patterns 20 and 22 may comprise, by way of example, Laminar ® dry film polymer, sold by Dynachem Corp. of Santa Anna, Calif. The photoresist patterns 20 and 22 protect portions of the metallic sheet 24 which they cover from "attack" or etching by an etchant, used as discussed below.

In particular, I cover the upper side of area 26 of metallic sheet 24, which is to be fashioned into interconnect member 16 (FIG. 1) in accordance with my invention, with portion 21 of photoresist pattern 20; I do not cover its lower side, however, with photoresist pattern 22. As to the remaining areas of metallic sheet 24 that are illustrated, I either cover both their top and bottom sides with photoresist patterns 20 and 22, respectively, or cover neither of their top and bottom sides, as, for example, in area 28. The provision of portion 21 of photoresist pattern 20 for implementing the interconnect member 16 (FIG. 1) can be accomplished as part of the same process steps required to implement photoresist pattern 20.

I etch metallic sheet 24, protected by photoresist patterns 20 and 22, by spraying with, or immersing in, a wet chemical etchant (not shown), such as ferric chloride, at least where the metallic sheet comprises copper. The wet chemical etchant attacks or etches the surfaces of the metallic sheet 24 which are not protected by photoresist patterns 20 and 22. In particular, the wet chemical etchant etches from both sides of metallic sheet 24, and, for example, in area 28, metallic sheet 24 is etched (or penetrated) completely through. When the sheet 24 has been completely penetrated in area 28, it is only partially penetrated in area 26, because the etchant cannot contact its upper surface, which is covered by portion 21 of photoresist pattern 20. At this point in time, sheet 24 has been etched approximately half-way through in area 26. I prefer to remove metallic sheet 24 from the wet chemical etchant at this point, and, consequently, no alteration in the etching step is required to implement interconnect member 16 (FIG. 1) in area 26 of sheet 24. Metallic sheet 24, which is now patterned like conductor pattern 12 (FIG. 1), appears as illustrated in FIG. 3.

I then remove photoresist patterns 20 and 22 from the metallic sheet 24, shown in FIG. 3, with a photoresist stripper, such as that sold by the Inland Chemical Corp. of Oneida, N.Y. and designated CODE AP-612. As depicted in FIG. 4, I next place the patterned metallic sheet 24 on substrate 14. I use a eutectic bonding technique to bond the patterned metallic sheet 24 to substrate 14. I prefer to use eutectic bonding techniques of the type described (and claimed) in the following U.S. Pat. Nos. 3,766,634—G. L. Babcock et al and 3,994,430—D. A. Cusano et al, assigned to the assignee of this invention. These techniques each involve the formation at an elevated temperature of a eutectic alloy consisting essentially of metal from a metallic sheet, e.g., copper, to be bonded to a substrate, and a heat reactive substance, e.g., oxygen, at least where the metallic sheet comprises copper. A further eutectic bonding technique is described, (and claimed), for example, in U.S. Pat. No. 2,857,663—J. E. Beggs, assigned to the assignee of this invention, and involves forming at an elevated temperature a eutectic alloy between a metallic sheet and a substrate by interposing a metallic shim between the sheet and the substrate. The entire disclosures of each of the foregoing patents are incorporated herein by reference.

During bonding of the patterned metallic sheet 24 to substrate 14, I have found it useful to support area 26 of the patterned metallic sheet 24, which implements interconnect member 16 (FIG. 1), by an auxiliary support 30 when a long interconnect member 16 is desired. Auxiliary support 30 comprises a material to which area 26 of the patterned metallic sheet 24 does not bond. At least where metallic sheet 24 comprises copper and the heat reactive substance (of the eutectic alloy) comprises oxygen, auxiliary support 30 suitably comprises one of the following materials: molybdenum, tungsten, firebrick, and a ceramic such as alumina or beryllia, coated with graphite on its upper surface. After the patterned metallic sheet 24 has been bonded to substrate 14, it appears as conductor pattern 12 of assembly 10 (FIG. 1). The use of auxiliary support 30 entails only a minimal amount of extra effort in fabricating assembly 10 (FIG. 1).

Turning to FIG. 5, an enlarged portion of assembly 10 (FIG. 1) is shown to illustrate dimensions of interconnect member 16 that I have been able to attain. With conductor pattern 12 comprising copper, and the elevated temperature at which a preferred molten eutectic alloy of copper and copper oxide forms being about 1065° C., or within approximately 50° C. of the melting point of copper conductor pattern 12, i.e., 1083° C., I have been able to repeatedly fabricate an interconnect member 16 having an unbonded length L of 70 mils (i.e., 0.70 inch, or 0.178 cm) where its thickness T is 5 mils (0.013 cm) and the thickness of conductor pattern 12 is 10 mils (0.025 cm). These results were obtained without using auxiliary support 30 (FIG. 4) during bonding. The width W of interconnect member 16 does not appear to have a significant bearing on how long the length L can be.

The foregoing results describe only one possible implementation of interconnect member 16. Based on these results, elastic beam theory predicts that an interconnect member 16 having an unbonded length L of 150 mils (0.469 cm) could be obtained by utilizing, during bonding, auxiliary support 30 (FIG. 4), at least with the same conditions applying as the foregoing conditions of type and thickness of metal for conductor pattern 12 and eutectic alloy temperature. Where conductor pattern 12 comprises copper with a thickness of 5 mils (0.013 cm) and interconnect member 16 is half this thickness (i.e., 2.5 mils or 0.006 cm), elastic beam theory predicts that interconnect member 16 could have an unbonded length L of 42 mils (0.107 cm) if an auxiliary support 30 (FIG. 4) is not used, and an unbonded length L of 109 mils (0.277 cm) if an auxiliary support 30 is used. Further, for an interconnect member 16 with a given thickness, the higher above substrate 14 it is situated during bonding, the longer its length L can be and still remain unbonded to substrate 14, because it is then less likely to plastically conform to substrate 14 and become bonded thereto.

Considering again FIG. 5, my invention enables conductor pattern 12, upon which heat-producing electrical devices (not shown) are usually mounted, to properly operate at high voltages with respect to a metallic heat sink (not shown), upon which substrate 14 is typically attached. This is because interconnect member 16, fabricated in accordance with my invention, overhangs part of the upper surface of substrate 14. This departure from the teachings of the prior art increases the length of an electrical creepage path 32 on the surface of substrate 14 between conductor pattern 12 and the metallic heat sink under substrate 14. With the length L of interconnect member 16 comprising 79 mils (0.178 cm), conductor pattern 12 can be operated at more than 600 volts with respect to the metallic heat sink without degenerative flashover occurring along electrical creepage path 32. Because interconnect member 16 is not bonded to substrate 14, it can advantageously be bent upward to position 16' to ensure that, in use, interconnect member 16 does not accidentally make contact with substrate 14.

Figure 6:
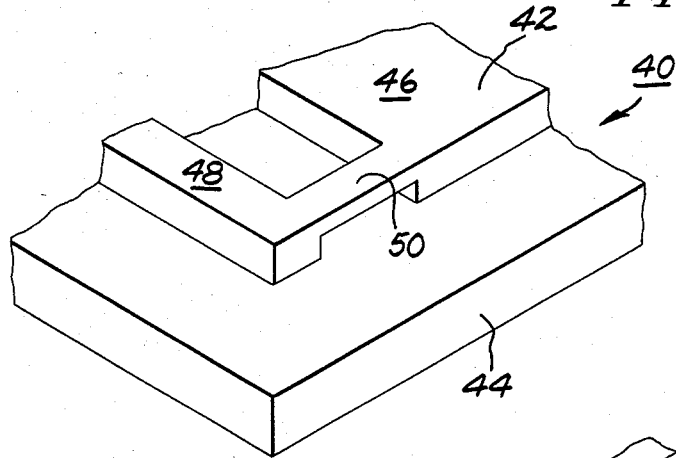
FIG. 6 is a view similar to FIG. 1 illustrating an alternative electrical assembly fabricated in accordance with my invention.

FIG. 6 illustrates an alternative electrical assembly 40 which can be fabricated in accordance with my invention. Assembly 40 comprises a conductor pattern 42 bonded to a substrate 44, the bond between conductor pattern 42 and substrate 44 comprising a eutectic alloy. Prior to bonding, conductor pattern 42 must be placed upon substrate 44. To prevent the otherwise unconnected portions 46 and 48 of conductor pattern 42 from becoming misaligned with each other, a mechanical interconnect member 50, similar to the abovedescribed electrical interconnect member 16, can be implemented in accordance with my invention. Interconnect member 50 can then be easily severed with a sharp instrument, for example, after conductor pattern 42 has been bonded to substrate 44. A suitable procedure for fabricating conductor pattern 42 including mechanical interconnect member 50 follows basically the same steps as the above-described procedure for fabricating conductor pattern 12 (FIG. 1) which includes electrical interconnect member 16, with the resulting length of member 50 being similar to the length of member 16 where auxiliary support 30 (FIG. 4) is used.

Figure 7:
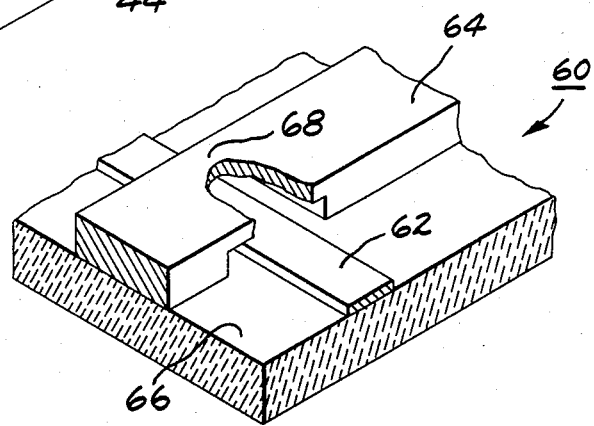
FIG. 7 is a view similar to FIG. 1, but in cross-section, illustrating a further alternative electrical assembly fabricated in accordance with my invention.

FIG. 7 illustrates a further electrical assembly 60 which can be fabricated in accordance with my invention. Assembly 60 comprises conductor patterns 62 and 64, which are both bonded to a substrate 66, the bond comprising a eutectic alloy. Conductor pattern 62 has less than half the thickness of conductor pattern 64. The thicker conductor pattern 64 includes a "via" or interconnect member 68 (shown partially removed), fabricated in accordance with my invention, which bridges over the thinner conductor pattern 62, without making contact to it. In fabricating assembly 60, conductor pattern 62 is first bonded to substrate 66. In a subsequent bonding step, the via 68 is bonded to substrate 66. Inasmuch as via 68 is similar to mechanical interconnect member 50 (FIG. 6), a suitable method for fabricating conductor pattern 64 with the via 68 follows from the foregoing description.

From the foregoing, it will be appreciated that my invention can produce various electrical assemblies, each of which includes a conductor pattern bonded to a non-metallic substrate and having selected areas which are not bonded to the substrate. It can also be appreciated that such non-bonded areas in a conductor pattern can be implemented with minimal extra effort.

While my invention has been described with respect to specific embodiments, many modifications and substitutions will be apparent to those skilled in the art. For example, metals other than copper, specifically mentioned above, could be used for implementing a conductor pattern, such as conductive metals described in the above-referenced patents. Furthermore, other types of non-metallic substrates could be used instead of ceramic, such as for example, a wafer of silicon semiconductor material, which is refractory and which may contain integrated electronic devices. Moreover, metal from a metallic sheet could be removed with means other than wet chemical etching, such as machining with a milling process or with a laser. It is, therefore, to be understood that the appended claims are intended to cover these and all such modifications and substitutions as fall within the true spirit and scope of my invention.

What I claim as my invention and desire to have secured by Letters Patent of the United States is:

1. A method of fabricating an assembly including a conductor pattern bonded to a non-metallic substrate, wherein the method includes bonding a patterned metallic sheet to the substrate by forming at an elevated temperature a molten eutectic alloy between the sheet and the substrate and consisting essentially of metal substantially identical to the metal of the metallic sheet and a heat reactive substance, the improvement for implementing a non-bonded member in the conductor pattern, comprising, prior to bonding, partially penetrating through a selected area of the side of the metallic sheet to be bonded to the substrate, said selected area having a length in excess of about 42 mils, whereby the remaining portion of the metallic sheet in the selected area constitutes a member which does not bond to the substrate.

2. The invention according to claim 1 wherein the heat reactive substance comprises oxygen.

3. The invention according to claim 1 wherein the molten eutectic alloy consists essentially of copper and copper oxidce.

4. The invention according to claim 1 wherein the metallic sheet comprises copper.

5. The invention according to claim 4 wherein the nonmetallic substrate comprises a ceramic substrate.

6. The invention according to claim 5 wherein the ceramic substrate comprises one of the group consisting of alumina and beryllia.

7. The invention according to claim 1 wherein the non-metallic substrate comprises a wafer of semiconductor material.

8. The invention according to claim 1 wherein the step of partially penetrating through the side of the metallic sheet comprises removing metal from the metallic sheet with a chemical etchant.

9. The invention according to claim 1 wherein the step of bonding the metallic sheet to the substrate includes the step of supporting the partially penetrated area of the metallic sheet with an auxiliary support.

10. In an assembly including a metallic sheet, a substrate comprising a wafer of semiconductor material, and a eutectic alloy situated between and bonding together the substrate and at least a portion of the metallic sheet, the eutectic alloy consisting essentially of metal substantially identical to the metal of the metallic sheet and a heat reactive substance, the improvement comprising at least one selected area of the metallic sheet with a length in excess of about 42 mils having a surface facing a surface of the substrate but being separated therefrom.

* * * * *